United States Patent [19]

Takiar et al.

[11] Patent Number: 4,684,975
[45] Date of Patent: Aug. 4, 1987

[54] MOLDED SEMICONDUCTOR PACKAGE HAVING IMPROVED HEAT DISSIPATION

[75] Inventors: Hem P. Takiar, San Jose; Kamal N. Mehta, Sunnyvale, both of Calif.

[73] Assignee: National Semiconductor Corporation, Santa Clara, Calif.

[21] Appl. No.: 809,442

[22] Filed: Dec. 16, 1985

[51] Int. Cl.[4] .............................................. H01L 23/36
[52] U.S. Cl. ...................... 357/70; 357/72; 357/81; 174/52 FP
[58] Field of Search ............... 428/596, 620, 624, 625, 428/626, 572; 174/52 FP; 357/72, 70, 69, 81; 29/588

[56] References Cited

U.S. PATENT DOCUMENTS

| | | | |
|---|---|---|---|
| 3,544,857 | 12/1970 | Byrne et al. | 428/565 |
| 4,308,339 | 12/1981 | Lindberg | 357/70 |
| 4,312,926 | 1/1982 | Burns | 357/69 |
| 4,326,238 | 4/1982 | Takeda et al. | 357/69 |
| 4,330,790 | 5/1982 | Burns | 357/70 |
| 4,331,740 | 5/1982 | Burns | 428/572 |
| 4,355,463 | 10/1982 | Burns | 29/827 |
| 4,380,042 | 4/1983 | Angelucci et al. | 357/70 |
| 4,396,936 | 8/1983 | McIver et al. | 357/81 |
| 4,466,183 | 8/1984 | Burns | 29/827 |
| 4,470,507 | 9/1984 | Burns | 206/330 |

FOREIGN PATENT DOCUMENTS

| | | | |
|---|---|---|---|
| 40062 | 3/1977 | Japan | 357/70 |
| 53-82168 | 7/1978 | Japan . | |
| 53-0133371 | 11/1978 | Japan . | |
| 48951 | 4/1980 | Japan | 357/70 |
| 82552 | 5/1983 | Japan | 357/70 |
| 143558 | 8/1983 | Japan | 357/81 |
| 1838 | 1/1985 | Japan | 357/69 |

*Primary Examiner*—L. Dewayne Rutledge
*Assistant Examiner*—John J. Zimmerman
*Attorney, Agent, or Firm*—Gail W. Woodward

[57] ABSTRACT

An improved metal tape for tape automated bonding provides for enhanced heat dissipation from the packaged semiconductor device. The invention includes two aspects. In the first aspect, individual metal tape leads are extended inward beyond the peripheral bonding pads of the semiconductor and over the active region of the semiconductor device. In this way, the leads are able to conduct heat away from the active region of the device. The second aspect of the invention relates to improved heat dissipation through the individual leads. The leads are flared or otherwise increased in area in the direction away from the active region of the semiconductor device to prove the radiative dissipation.

8 Claims, 6 Drawing Figures

U.S. Patent   Aug. 4, 1987   Sheet 1 of 3   4,684,975
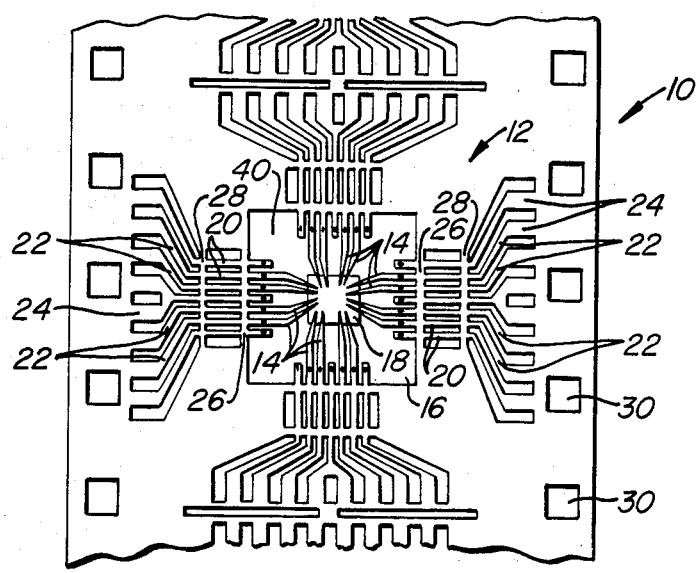
FIG.\_1.   PRIOR ART
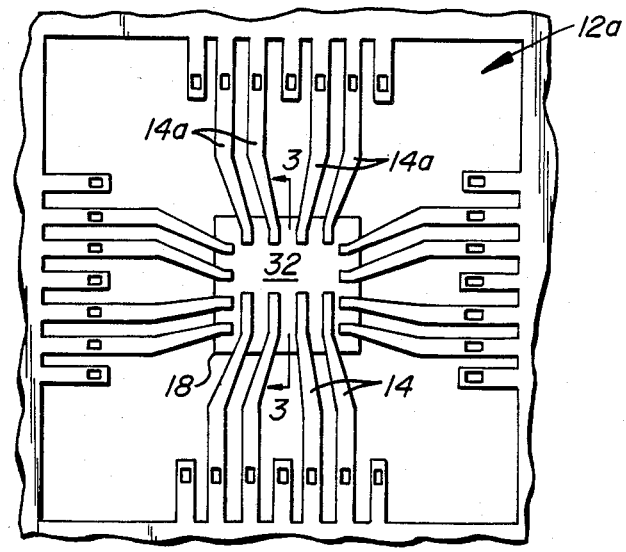
FIG.\_2.

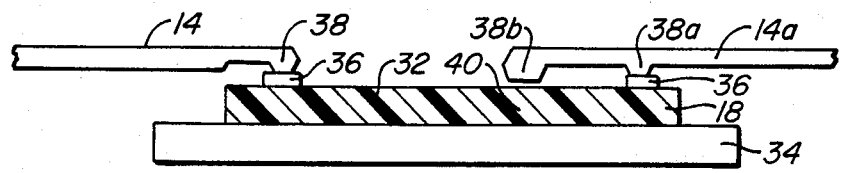
FIG._3.
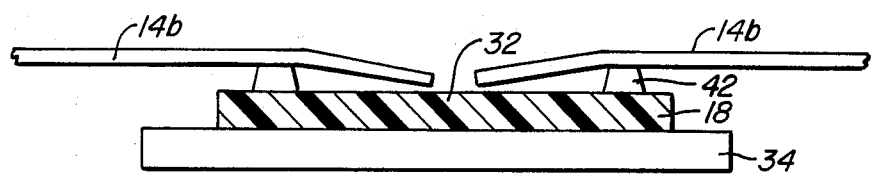
FIG._4.
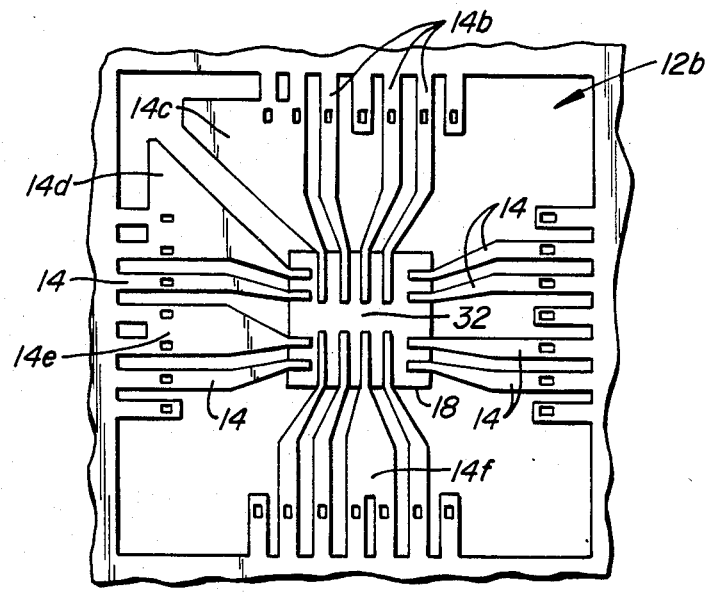
FIG._5.

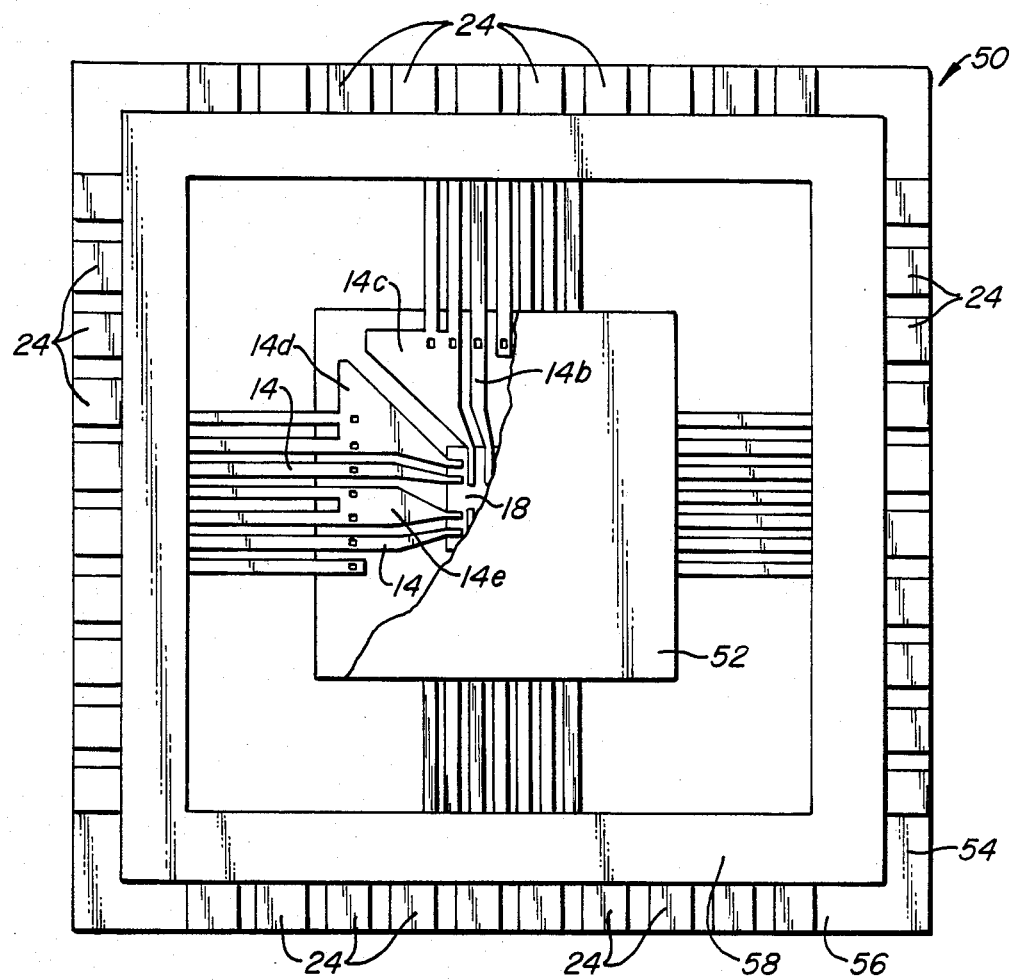
FIG._6.

MOLDED SEMICONDUCTOR PACKAGE HAVING IMPROVED HEAT DISSIPATION

BACKGROUND OF THE INVENTION

1. Field of the Invention

The present invention relates generally to tape automated bonding of semiconductor devices to form semiconductor packages, and more particularly to an improved manner for forming and connecting metal tape leads to improve heat dissipation from such packages.

Tape automated bonding is a method for simultaneously connecting a plurality of bonding pads on a semiconductor device to external circuitry. The method employs a continuous metal tape usually copper or copper plated with gold, nickel, tin, or combinations thereof, having individual frames defining metal leads which are arranged in a pattern so that the inner ends of the leads may be bonded to the bonding pads while the outer ends of the leads may be bonded to a conventional lead frame or left free to be otherwise connected to the desired circuitry.

Active circuit elements, including transistors, resistors, and the like, are located in the central portion of the semiconductor device, usually referred to as the active region, while the bonding pads are peripherally located around the active region. Such peripheral location facilitates connection to the bonding pads and also avoids damage to the active regions of the device during the bonding operation required to form the inner lead bonds. The bonding may be accomplished by either thermocompression bonding or reflow techniques, where the heat and/or pressure accompanying the bonding might result in damage to any underlying circuit elements.

Heat dissipation has long been a problem with semiconductor devices, particularly with bipolar and N-MOS, devices. The problem is exacerbated by encapsulation of the devices in plastic and ceramic packages. Numerous approaches have been developed over the years to enhance thermal dissipation from such packages, including the placement of metal heat sinks within the package to provide a direct heat dissipation path from the semiconductor device to the ambient surrounding the semiconductor package. While this approach is successful in many applications, it complicates the semiconductor packaging operation and is not always necessary for marginal heat dissipation requirements.

It would thus be desirable to provide additional semiconductor packaging techniques for producing semiconductor packages having enhanced heat dissipation characteristics, where the techniques may be easily incorporated into existing semiconductor packaging methodology. In particular, it would be desirable to provide an improved method for tape automated bonding of encapsulated semiconductor devices where the metal tape leads are utilized in an effective manner to dissipate heat from the semiconductor device through the encapsulation layer.

2. Description of the Background Art

Tape automated bonding is described in U.S. Pat. Nos. 4,330,790; 4,331,740; 4,355,463; 4,466,183; and 4,470,507. Heretofore, lead frames have been specially adapted to enhance thermal dissipation from semiconductor device packages. See, for example, Japanese Pat. Nos. 53-82168 and 53-133371 wherein lead frames having flared paddle supports for heat dissipation are described.

SUMMARY OF THE INVENTION

The present invention is based upon an improved design for metal automated bonding tapes which allows for enhanced heat dissipation from packaged semiconductor products. The first aspect of the present invention provides for such improvement by extending metal tape leads on the bonding tape over the central active region of the semiconductor device. Heretofore, the tape bonding leads would terminate at their inner ends at the point where the bond was formed on the periphery of the semiconductor device. The present invention, in contrast, provides for extending the metal tape leads beyond the bonding location over the active areas of the semiconductor device where the heat is generated. In this way, the leads can act to conduct heat away from the central portion to provide cooling where it is needed. In particular, the leads can be located directly over resistors and other circuit elements which are generating large amounts of heat to provide desired localized heat dissipation.

A second aspect of the present invention lies in the design of the individual metal tape leads as they extend outward or away from the semiconductor device. By flaring the leads to increase the cross-sectional area available for heat conduction, the heat dissipation of at least some of the leads may be improved. Combining the two aspects of the present invention greatly improves heat dissipation in tape automated bonded products.

The present invention is useful with conventional packages, such as a dual-in-line package, where the semiconductor device is mounted on a lead frame and the outer lead bond formed within the package. In such packages, the bonding tape lead conducts heat to the lead frame finger, and the lead frame finger, in turn, provides heat conduction through the package encapsulation to the ambient. The present invention is also useful for packages where the bonding tape leads are brought out from the package and used directly to connect the device to other circuitry, typically on a printed circuit board. In the latter case, the bonding tape lead conducts heat directly to the ambient.

BRIEF DESCRIPTION OF THE DRAWINGS

FIG. 1 illustrates prior art bonding tape having a semiconductor device attached to the inner ends of the bonding tape leads.

FIG. 2 illustrates the improved bonding tape of the present invention, particularly illustrating the first aspect where the inner ends of the leads are extended over the active region of the semiconductor device.

FIG. 3 is a simplified cross-sectional view taken along line 3—3 of FIG. 2 and illustrating the bonding of the bumped tape of the prior art with that of the present invention.

FIG. 4 is similar to FIG. 3, except that the bonding of flat tape by the present invention is illustrated.

FIG. 5 illustrates both improved aspects of the present invention.

FIG. 6 is a semiconductor package with portions broken away illustrating the improved metal bonding tape of the present invention.

DESCRIPTION OF THE PREFERRED EMBODIMENT

The present invention concerns tape automated bonding of semiconductor devices, either to lead frames or directly to other circuitry. A prior art bonding tape 10 which does not include the improved aspects of the present invention is illustrated in FIG. 1. The bonding tape 10 includes a plurality of individual frames 12 defined by individual tape leads 14 extending into an open window 16. As illustrated, the tape leads 14 are bonded along all four peripheral edges of a square semiconductor device 18. As is well known in the background art, however, the number and arrangement of the individual tape leads may be varied within wide limits to accomodate most types of semiconductor devices.

The tape leads 14 extend outward from the semiconductor device 18 and include segments 20 and 22, terminating in connecting pads 24. The various segments of the leads 14 are joined by tie bars 26 and 28 which are an integral part of the bonding tape. The tie bars 26 and 28 will be severed from the tape during the package assembly process, as will be described in greater detail hereinafter. The tape 10 includes registration holes 30 which allow automatic advancement of the tape during the assembly process.

Bonding tapes of the present invention are normally formed from copper or a copper core plated with gold, nickel, tin, or combinations of the three. The tape may be fabricated by conventional chemical etching or stamping techniques.

Referring now to FIGS. 2 and 3, a first aspect of the present invention relates to the extension of the tape leads 14 over an active area 32 of the semiconductor device 18. FIG. 2 illustrates a tape window 12a having conventional leads 14 as well as modified leads 14a bonded to the semiconductor device 18. All other aspects of the tape may be the same as illustrated in FIG. 1. The tape leads 14 and 14a are illustrated as bump tape which are bonded to peripheral bonding pads 36.

As illustrated on the left of FIG. 3, conventional lead 14 terminates in bump 38 which is bonded by conventional means (i.e., thermocompression or reflow) to the bonding pad 36. Lead 14 does not extend inward (i.e., to the right in FIG. 3) beyond the bonding pad 36. In contrast, extended lead 14a includes a pair of bumps 38a and 38b, where the first bump 38a is bonded to the bonding pad 36. Lead 14a extends inward (i.e., to the left in FIG. 3) beyond the bonding pad 36 and over a particular circuit element 40 which generates heat. The second bump 38b is located directly above circuit element 40 and extends downward, and optionally may contact the surface of the semiconductor device 18 at this point. In some applications, the bump 38b may be bonded to the point of heat generation to improve the heat conduction. Care should be taken when forming such bonds to avoid damage of the active region of the semiconductor device 18.

Referring now to FIG. 4, flat tape leads 14b may also be used in the present invention. The flat tape leads 14b are bonded to metal bumps 42 at a first location along each lead. The leads 14b extend inward over the active region 32 of the semiconductor device and typically will be deflected downward so that the ends of the leads 14b will be in closer proximity to the surface of the active region 32. The leads 14b may be bent down during the lead tape fabrication process, or may be bent down later during the package assembly operation.

The present invention allows for broad latitude in locating the extended leads 14a or 14b in any desired pattern. For example, it might be desirable to extend both sets of leads on opposite sides of the semiconductor device to fully cover the surface of the active region. It would even be possible to widen the leads as they extend over the semiconductor device to eliminate most of the gaps therebetween.

Referring now to FIG. 5, the second aspect of the present invention comprises the flaring of the tape leads 14 in order to further enhance heat conduction away from the active region 32 of the semiconductor 18. As with FIG. 2, a single frame window 12b is shown to illustrate the inner ends or fingers of the leads 14, while the remainder of the leads including segments 20 and 22 remain as illustrated in FIG. 1. The leads 14 along the righthand side of the window 12b are essentially the same as those illustrated in FIG. 1. The leads 14b and 14c along the top of window 12b, however, have been modified to increase the cross-sectional area of the lead by flaring. Referring in particular to lead 14c, the single lead has been flared to occupy approximately one-half of the empty quadrant 40 illustrated in the embodiment of FIG. 1. It will be appreciated that this increased area will act to enhance the conduction or dissipation of heat away from the semiconductor chip 18, even though the portion of the lead 14c in FIG. 5 will generally be encapsulated in the final package. In addition to dissipating heat within the package, the lead 14c is connected to a pair of lead segments 20 and 22. In this way, increased heat transmission away from the package is achieved when the lead segments 20 and 22 extend out of the encapsulated portion of the package.

Leads may also be flared at other locations around the semiconductor device 18. Lead 14e occupies sufficient space for a pair of leads, but is connected to only a single bonding pad. A similar construction is shown with lead 14f at the bottom of FIG. 5.

The two aspects of the present invention will usually be combined as is illustrated with lead 14c in FIG. 5. There, the lead 14c is both flared and has an extended portion passing over the active region 32 of the semiconductor device 18.

Referring now to FIG. 6, an exemplary semiconductor package 50 fabricated from metal bonding tape according to the present invention is illustrated. The semiconductor device 18 is bonded to leads 14, 14b, 14c, 14d, and 14e, as described previously. The semiconductor 18 and the various leads are encapsulated in a coating material 52, typically an impact resistant plastic. As illustrated, the various flared portions of the leads are included within the boundary of encapsulation, but the outer segments 22 and 24 of the leads extend beyond the boundary of encapsulation. The tie bars 26 and 28 have been severed during the assembly operation in the conventional manner so that the leads 14 are electrically isolated from one another. The terminal pads 24 are mounted on a support frame 54 which is molded in the same molding operation in which the plastic coating 52 was formed. The terminal pads 24 are exposed in their fully extended position. The package 50 may then be mounted in a receptacle (not illustrated) having contact members to engage at least some of the terminal pads 24.

Although the foregoing invention has been described in some detail by way of illustration and example for purposes of clarity of understanding, it will be obvious that certain changes and modifications may be practiced within the scope of the appended claims.

What is claimed is:

1. A semiconductor package having enhanced heat dissipation, said package comprising an encapsulated semiconductor device having a plurality of bonding pads arranged around its periphery and metal tape leads bonded to said bonding pads, wherein said metal tape leads extend inward from the bonding pads and over central active regions on the semiconductor device, whereby said leads are able to conduct heat outward from the central regions.

2. A semiconductor package as in claim 1, wherein the metal tape leads extend beyond the encapsulation of the device.

3. A semiconductor package as in claim 1, wherein the metal tape leads are bonded to a metal lead frame within the encapsulation.

4. A semiconductor package as in claim 1, wherein at least some of the metal tape leads are flared in the direction away from the semiconductor device to improve heat dissipation from the device.

5. A semiconductor package as in claim 1, wherein said metal tape is flat tape.

6. A semiconductor package as in claim 1, wherein said metal tape is bump tape.

7. A semiconductor package as in claim 6, wherein said bump tape has bumps formed over the bonding pads and bumps formed over the central active regions.

8. A semiconductor package as in claim 1, wherein the metal tape leads are copper or copper plated with gold, nickel, tin, or combinations thereof.

* * * * *